(12) United States Patent
Basker et al.

(10) Patent No.: US 10,559,690 B2
(45) Date of Patent: Feb. 11, 2020

(54) EMBEDDED SOURCE/DRAIN STRUCTURE FOR TALL FINFET AND METHOD OF FORMATION

(71) Applicant: International Business Machines Corporation, Armonk, NY (US)

(72) Inventors: Veeraraghavan S. Basker, Schenectady, NY (US); Kangguo Cheng, Schenectady, NY (US); Ali Khakifirooz, Los Altos, CA (US); Henry K. Utomo, Newburgh, NY (US); Reinaldo Ariel Vega, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/672,586

(22) Filed: Aug. 9, 2017

(65) Prior Publication Data

US 2019/0051751 A1  Feb. 14, 2019
US 2019/0252548 A9  Aug. 15, 2019

Related U.S. Application Data

(62) Division of application No. 14/490,274, filed on Sep. 18, 2014, now Pat. No. 9,818,877.

(51) Int. Cl.
*H01L 29/78* (2006.01)
*H01L 29/04* (2006.01)
(Continued)

(52) U.S. Cl.
CPC .... *H01L 29/7853* (2013.01); *H01L 21/02529* (2013.01); *H01L 21/762* (2013.01);
(Continued)

(58) Field of Classification Search
CPC ......... H01L 29/41791; H01L 29/66795; H01L 29/785; H01L 29/7842; H01L 21/823431; H01L 21/845; H01L 27/0886
(Continued)

(56) References Cited

U.S. PATENT DOCUMENTS 6,888,181 B1  5/2005  Liao
7,348,642 B2  3/2008  Nowak
(Continued)

FOREIGN PATENT DOCUMENTS

EP  2002468 B1  7/2013
JP  P2009532907 A  9/2009
(Continued)

OTHER PUBLICATIONS

S. Bing et al.; High-Quality Crystalline Ge(111) Graowth on Si(111) Substrates by Solid Phase Epitaxy; Chinese Phys. Lett., 29, 2011, Abstract.
(Continued)

*Primary Examiner* — George R Fourson, III
(74) *Attorney, Agent, or Firm* — Cantor Colburn LLP; Steven Meyers

(57) ABSTRACT

A shallow trench isolation layer is formed on a structure comprising semiconductor fins. Portions of the fins are recessed to a level below the shallow trench isolation layer. Epitaxial stressor regions are then formed on the recessed fin areas. A bottom portion of the epitaxial stressor regions are contained by the shallow trench isolation layer, which delays formation of the diamond shape as the epitaxial region is grown. Once the epitaxial stressor regions exceed the level of the shallow trench isolation layer, the diamond shape starts to form. The result of delaying the start of the diamond growth pattern is that the epitaxial regions are narrower for a given fin height. This allows for taller fins, which provide
(Continued)

more current handling capacity, while the narrower epitaxial stressor regions enable a smaller fin pitch, allowing for increased circuit density.

13 Claims, 18 Drawing Sheets

(51) Int. Cl.
| | |
|---|---|
| H01L 29/66 | (2006.01) |
| H01L 29/06 | (2006.01) |
| H01L 21/762 | (2006.01) |
| H01L 29/16 | (2006.01) |
| H01L 21/02 | (2006.01) |
| H01L 29/08 | (2006.01) |
| H01L 21/8234 | (2006.01) |
| H01L 21/84 | (2006.01) |
| H01L 29/417 | (2006.01) |
| H01L 27/088 | (2006.01) |

(52) U.S. Cl.
CPC ........ *H01L 29/045* (2013.01); *H01L 29/0649* (2013.01); *H01L 29/0847* (2013.01); *H01L 29/1608* (2013.01); *H01L 29/6656* (2013.01); *H01L 29/66545* (2013.01); *H01L 29/66795* (2013.01); *H01L 21/823431* (2013.01); *H01L 21/845* (2013.01); *H01L 27/0886* (2013.01); *H01L 29/41791* (2013.01); *H01L 29/785* (2013.01); *H01L 29/7842* (2013.01)

(58) Field of Classification Search
USPC .......................................................... 257/331
See application file for complete search history.

(56) References Cited

U.S. PATENT DOCUMENTS

| | | | |
|---|---|---|---|
| 7,872,303 B2 | 1/2011 | Chan et al. | |
| 8,030,144 B2 | 10/2011 | Luning et al. | |
| 8,278,179 B2 | 10/2012 | Lin et al. | |
| 8,313,999 B2 | 11/2012 | Cappellani et al. | |
| 8,445,334 B1 | 5/2013 | Basker et al. | |
| 8,445,892 B2 | 5/2013 | Cohen et al. | |
| 8,652,894 B2 | 2/2014 | Lin et al. | |
| 8,703,556 B2 | 4/2014 | Kelly et al. | |
| 9,368,512 B1* | 6/2016 | Cheng | H01L 27/1211 |
| 10,056,473 B1* | 8/2018 | Wang | H01L 29/66795 |
| 10,164,041 B1* | 12/2018 | Xie | H01L 27/0886 |
| 2008/0185691 A1 | 8/2008 | Cheng | |
| 2008/0265321 A1 | 10/2008 | Yu et al. | |
| 2010/0065917 A1 | 3/2010 | Ohta et al. | |
| 2010/0261328 A1 | 10/2010 | Kujirai | |
| 2011/0223736 A1 | 9/2011 | Lin et al. | |
| 2011/0291188 A1 | 12/2011 | Cheng | |
| 2013/0049068 A1* | 2/2013 | Lin | H01L 29/7853 257/192 |
| 2013/0052801 A1 | 2/2013 | Berliner et al. | |
| 2013/0175638 A1 | 7/2013 | Ho et al. | |
| 2013/0178024 A1 | 7/2013 | Flachowsky | |
| 2013/0187228 A1 | 7/2013 | Xie et al. | |
| 2013/0240836 A1 | 9/2013 | Lee et al. | |
| 2013/0285152 A1 | 10/2013 | Adam et al. | |
| 2013/0334615 A1 | 12/2013 | Ho et al. | |
| 2014/0027816 A1 | 1/2014 | Cea | |
| 2014/0065782 A1* | 3/2014 | Lu | H01L 29/785 438/294 |
| 2014/0134814 A1 | 5/2014 | Wong et al. | |
| 2014/0183599 A1 | 7/2014 | Hong | |
| 2014/0252489 A1* | 9/2014 | Yu | H01L 29/66795 257/368 |
| 2014/0312427 A1* | 10/2014 | Maeda | H01L 27/0924 257/369 |
| 2014/0374827 A1* | 12/2014 | Suh | H01L 29/785 257/347 |
| 2015/0008489 A1 | 1/2015 | Ching et al. | |
| 2015/0170916 A1* | 6/2015 | Yu | H01L 21/02664 438/493 |
| 2015/0255543 A1* | 9/2015 | Cheng | H01L 29/7848 257/288 |
| 2015/0263122 A1* | 9/2015 | Hsiao | H01L 29/515 257/401 |
| 2015/0270342 A1* | 9/2015 | Tsai | H01L 29/0847 257/43 |
| 2015/0279840 A1* | 10/2015 | Huang | H01L 29/66545 257/384 |
| 2015/0295089 A1* | 10/2015 | Huang | H01L 29/7853 257/401 |
| 2015/0372140 A1* | 12/2015 | Liu | H01L 29/7848 257/190 |
| 2016/0260833 A1* | 9/2016 | Basker | H01L 29/7853 |
| 2017/0162566 A1* | 6/2017 | Chang | H01L 27/0886 |
| 2017/0250266 A1* | 8/2017 | Huang | H01L 29/66545 |
| 2017/0263748 A1* | 9/2017 | Kittl | H01L 29/41791 |
| 2017/0338346 A1* | 11/2017 | Kittl | H01L 29/66795 |
| 2017/0345932 A1* | 11/2017 | Kittl | H01L 29/66795 |
| 2018/0108572 A1* | 4/2018 | Zhao | H01L 21/82343 |

FOREIGN PATENT DOCUMENTS

| | | |
|---|---|---|
| JP | 2010073869 A | 4/2010 |
| JP | 2013030776 A | 2/2013 |

OTHER PUBLICATIONS

H. Kawasaki et al.; Challenges and Solutions of FinFET Integration in an SRAM Cell and a Logic Circuit for 22 nm Node and Beyond; IEEE International Electron Devices Meeting (IEDM), 2009, 4 pages.
F. Sato et al.; Solid-Phase Epitaxy with X-Ray Irradiation to Grow Dislocation-Free Silicon Films at Low Temperatures; Japanese Journal of Applied Physics, vol. 30, Issue 2A, pp. L505-L208, 1991, Abstract.
Basker, et al., "Embedded Source/Drain Structure for Tall Finfet and Method of Formation," U.S. Appl. No. 14/490,274, filed Sep. 18, 2014.
List of IBM Patents or Patent Applications Treated As Related (Appendix P), Date filed Jul. 23, 2019; 2 pages.
List of IBM Patents or Patent Applications Treated As Related (Appendix P), Date Filed Aug. 15, 2019; 2 pages.
Basker, et al., "Embedded Source/Drain Structure for Tall Finfet and Method of Formation," U.S. Appl. No. 16/541,437, filed Aug. 15, 2019.

* cited by examiner

US 10,559,690 B2

EMBEDDED SOURCE/DRAIN STRUCTURE FOR TALL FINFET AND METHOD OF FORMATION

CROSS REFERENCE TO RELATED APPLICATIONS

This application is a division of commonly-owned, copending U.S. patent application Ser. No. 14/490,274 entitled EMBEDDED SOURCE/DRAIN STRUCTURE FOR TALL FINFET AND METHOD OF FORMATION, and filed on Sep. 18, 2014.

FIELD OF THE INVENTION

The present invention relates generally to semiconductor fabrication, and more particularly to the fabrication of fin-type field effect transistors (finFETs).

BACKGROUND OF THE INVENTION

With the continuing trend towards miniaturization of integrated circuits (ICs), there is a need for transistors with increasingly smaller dimensions. FinFET technology is becoming more prevalent as device size continues to shrink. There is also a need for increased current capacity in devices to accommodate the various functions of products such as mobile computing, telecommunications, and networking, to name a few. However, the ability to provide increased current capacity with reduced dimensions is challenging. It is therefore desirable to have improved finFET devices and methods of fabrication to address the aforementioned issues.

SUMMARY OF THE INVENTION

In a first aspect, embodiments of the present invention provide a method of forming a semiconductor structure, comprising: forming a fin over a semiconductor substrate; forming a shallow trench isolation layer over the semiconductor substrate; recessing the shallow trench isolation layer to a level below a top surface of the fin; forming a dummy gate structure over the fin; forming spacers adjacent to the dummy gate structure; recessing a portion of the fin that is adjacent to the spacers to form a stressor cavity; forming an epitaxial stressor region in the stressor cavity; removing the dummy gate structure to form a gate cavity; recessing the shallow trench isolation layer to a level below a bottom of the dummy gate structure; and forming a metal gate structure in the gate cavity.

In a second aspect, embodiments of the present invention provide a semiconductor structure comprising: a semiconductor substrate; a semiconductor fin disposed over the semiconductor substrate, the semiconductor fin comprising a fin base; and a tree shaped epitaxial region disposed on the fin base.

In a third aspect, embodiments of the present invention provide a semiconductor structure comprising: a semiconductor substrate; a semiconductor fin disposed over the semiconductor substrate, the semiconductor fin comprising a fin base; a tree shaped epitaxial region disposed on the fin base; a gate structure disposed on the semiconductor fin; a plurality of spacers disposed adjacent to the gate structure; and a shallow trench isolation layer disposed underneath at least one of the plurality of spacers.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Figure 1A:
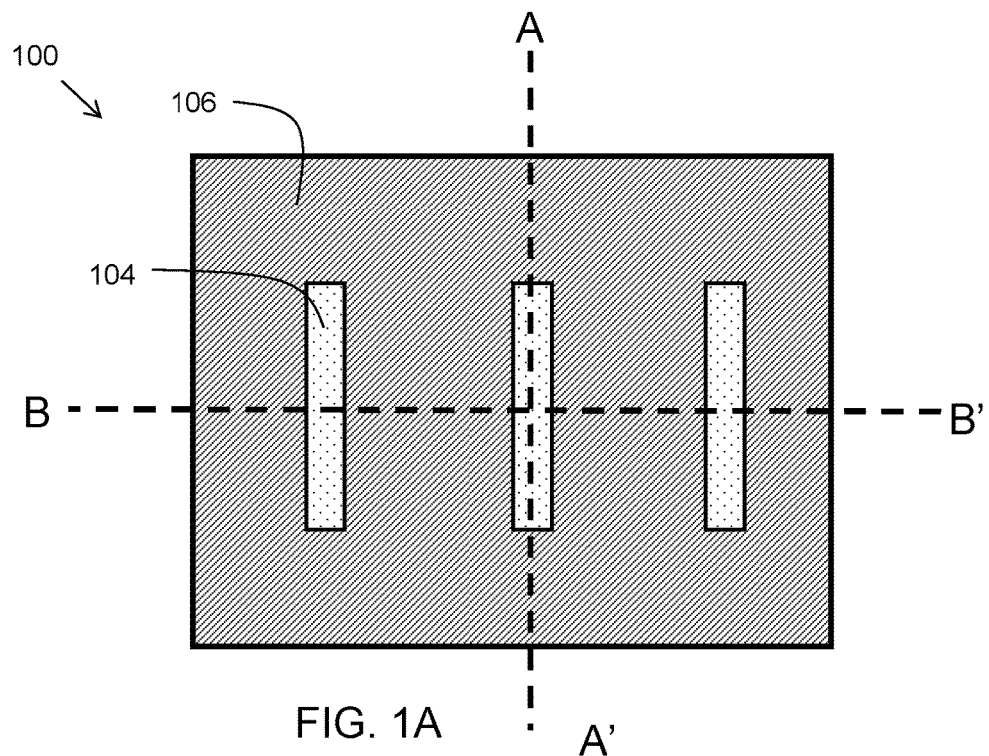

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

FIG. 1A is a top down view of a semiconductor structure at a starting point for embodiments of the present invention.

Figure 1B:
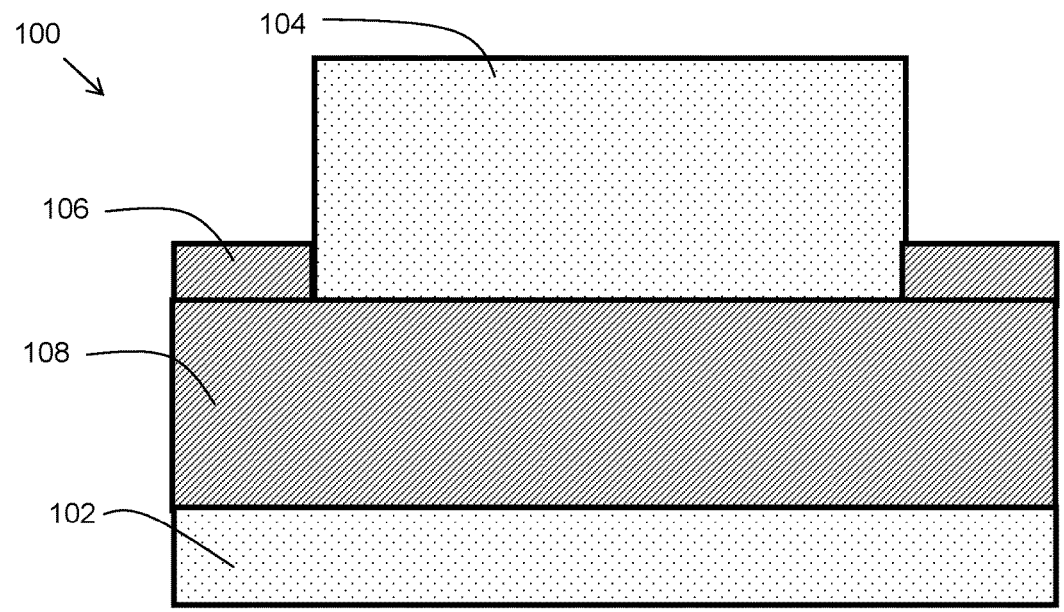

FIG. 1B is a cross sectional view of the semiconductor structure of FIG. 1A as viewed along line A-A' of FIG. 1A.

Figure 2A:
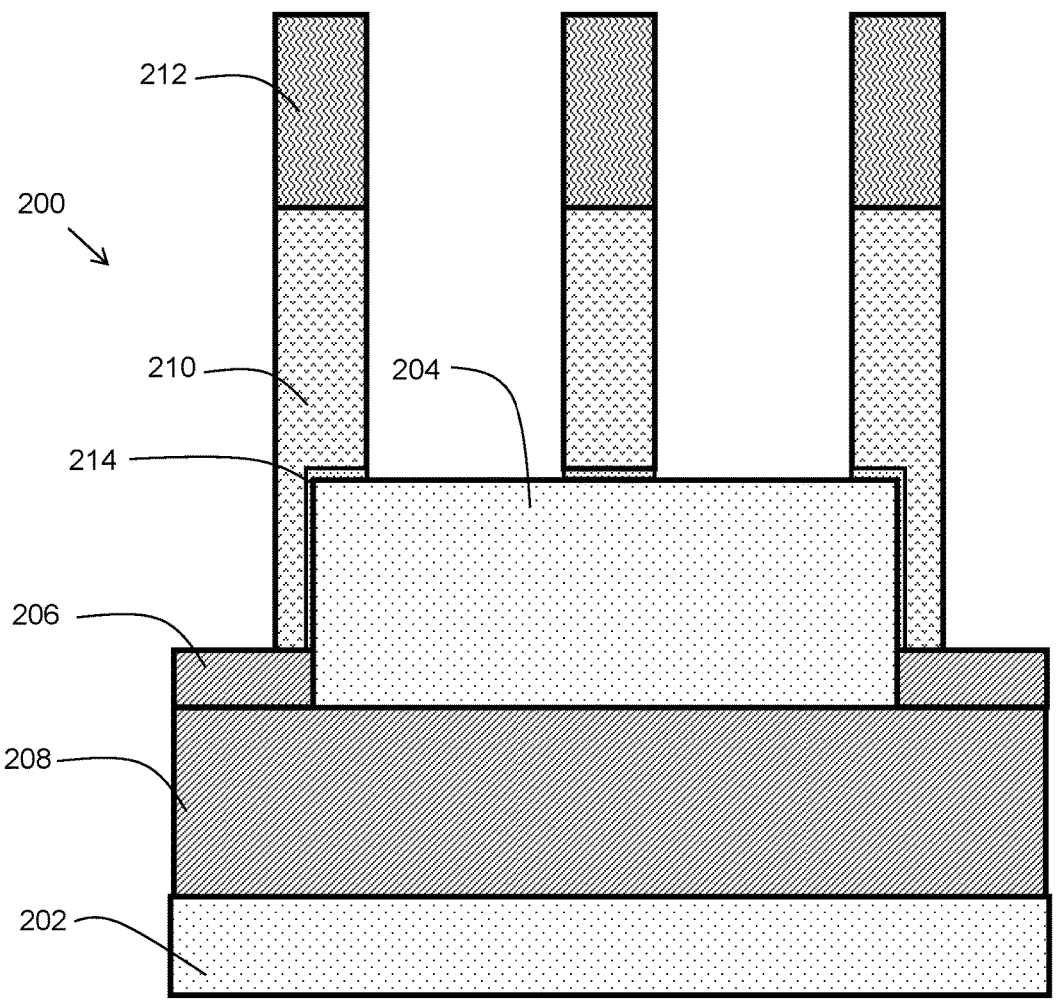

FIG. 2A is a cross sectional view of a semiconductor structure after a subsequent process step of forming dummy gates as viewed along line A-A' of FIG. 1A.

Figure 2B:
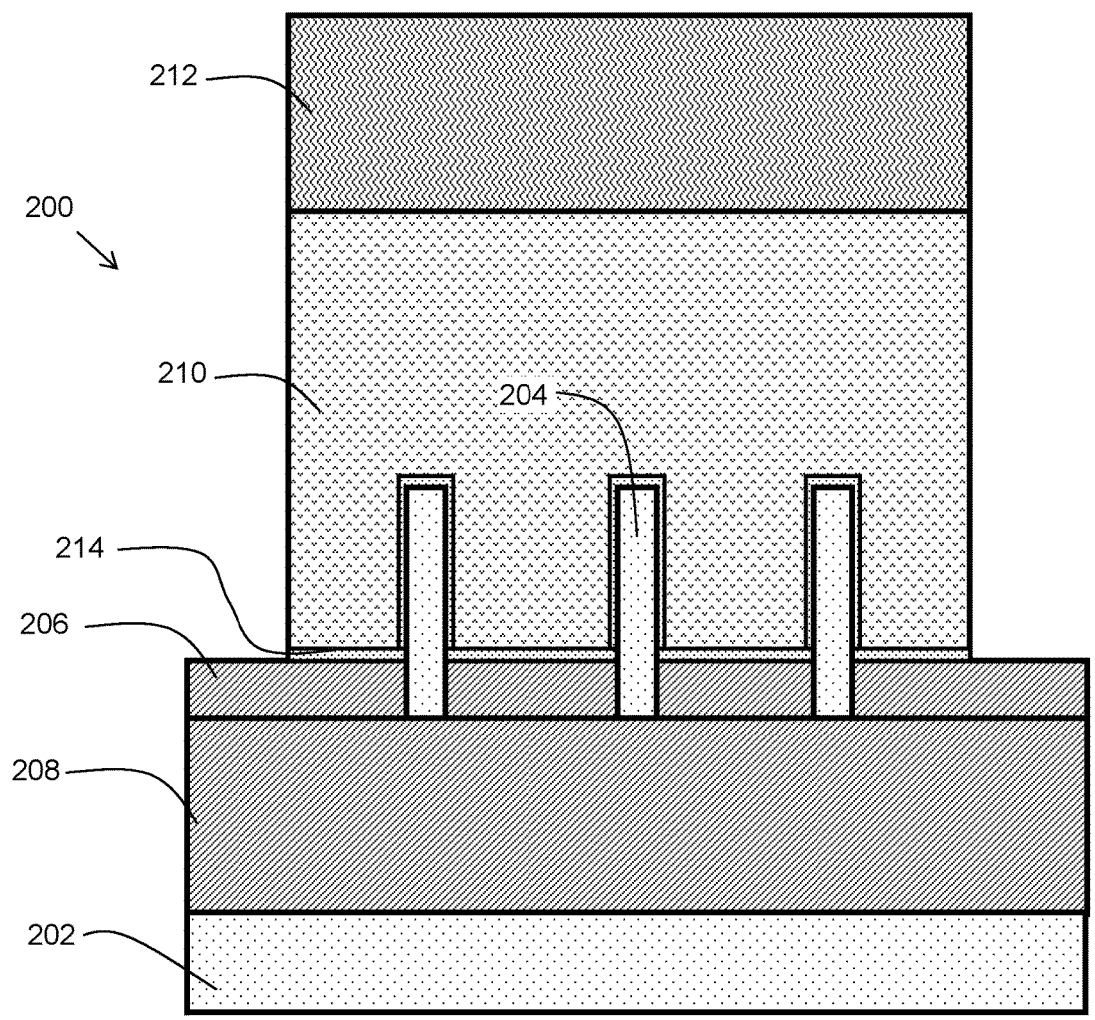

FIG. 2B is a cross sectional view of a semiconductor structure after a subsequent process step of forming dummy gates as viewed along line B-B' of FIG. 1A.

Figure 3A:
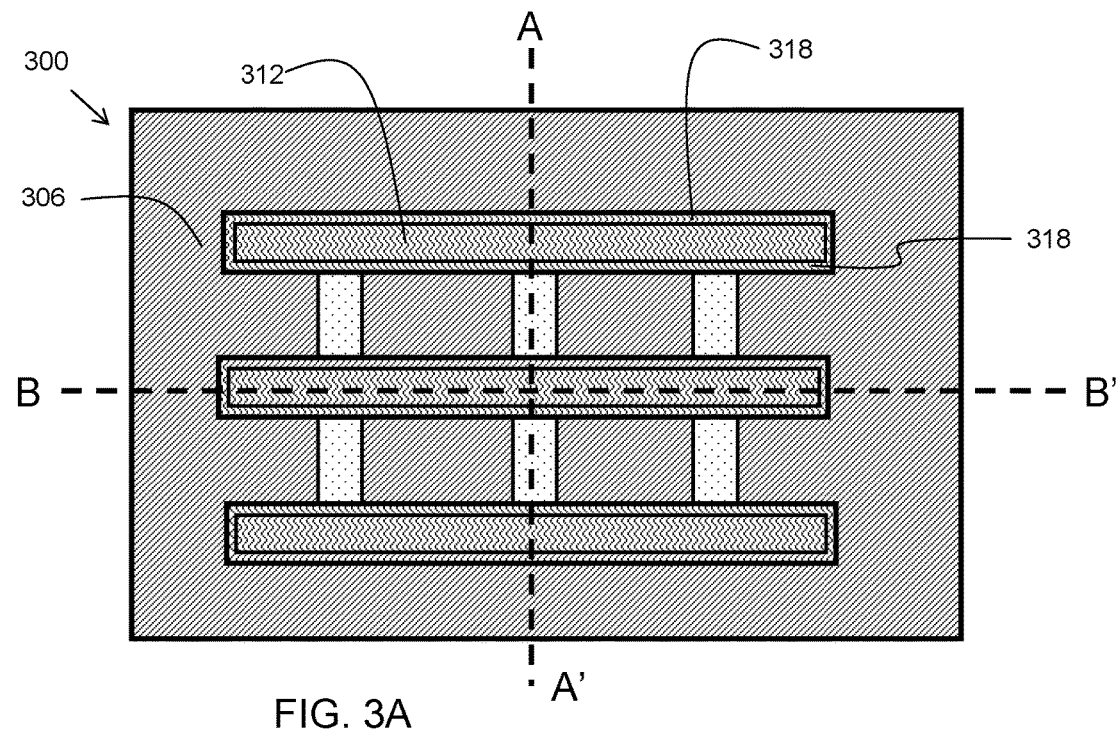

FIG. 3A is a top down view of a semiconductor structure after a subsequent process step of forming gate spacers.

Figure 3B:
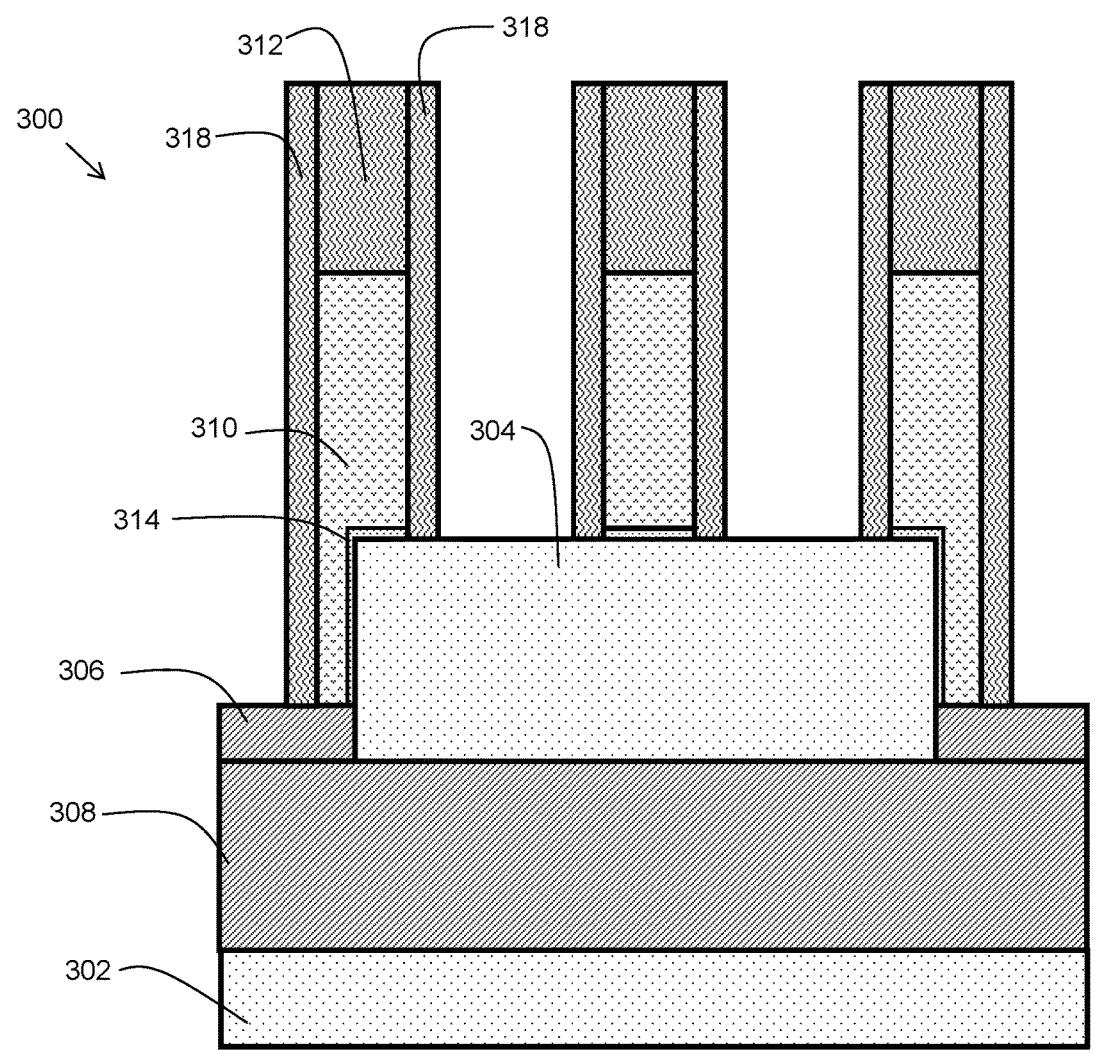

FIG. 3B is a cross sectional view of the semiconductor structure of FIG. 3A as viewed along line A-A'.

Figure 4A:
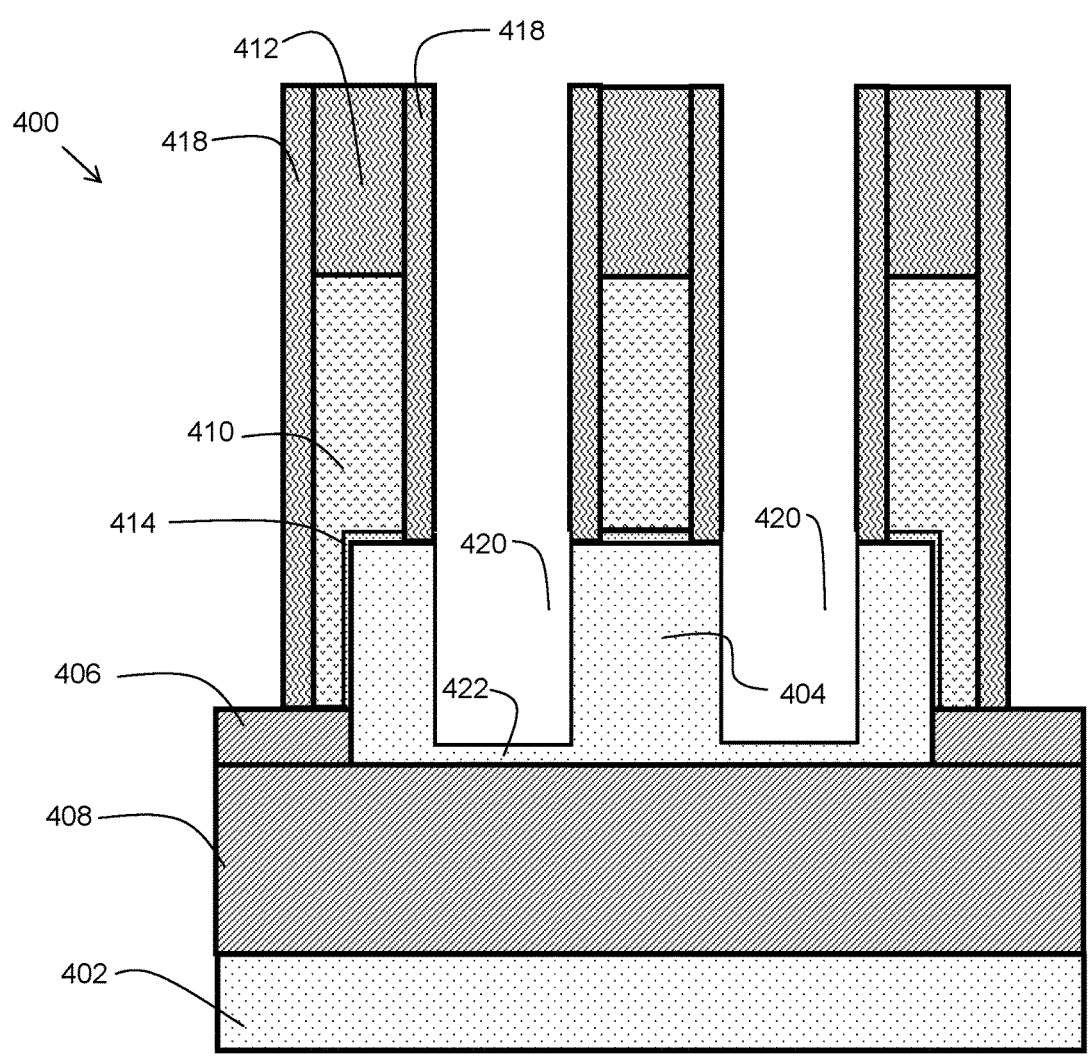

FIG. 4A is a cross sectional view of the semiconductor structure of FIG. 3A as viewed along line A-A' after a subsequent process step of fin recess.

Figure 4B:
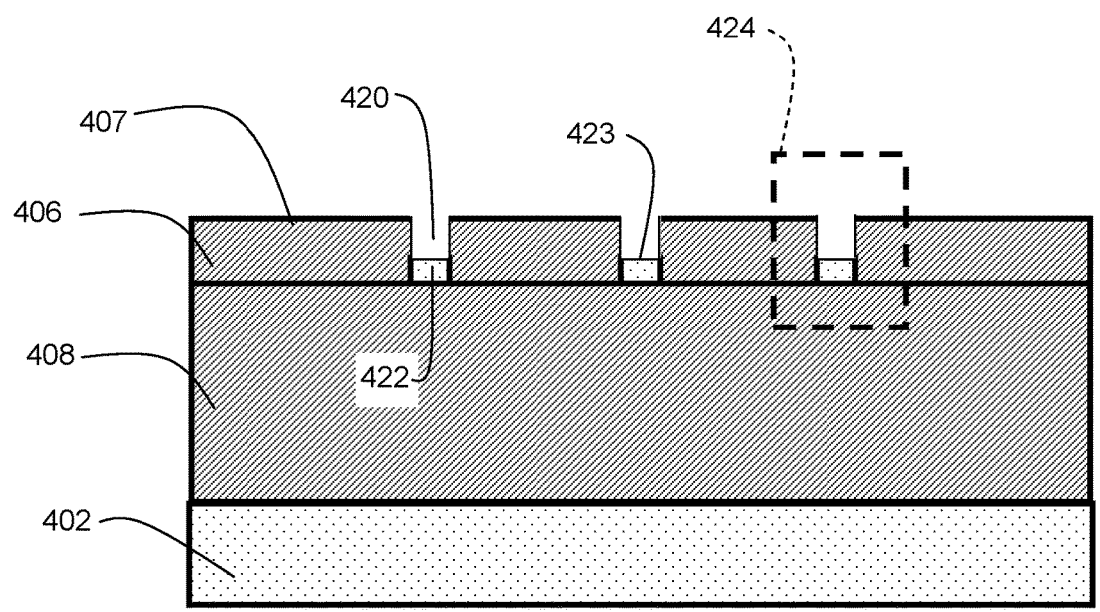

FIG. 4B is a cross sectional view of the semiconductor structure of FIG. 3A as viewed along line B-B' after a subsequent process step of fin recess.

Figure 4C:
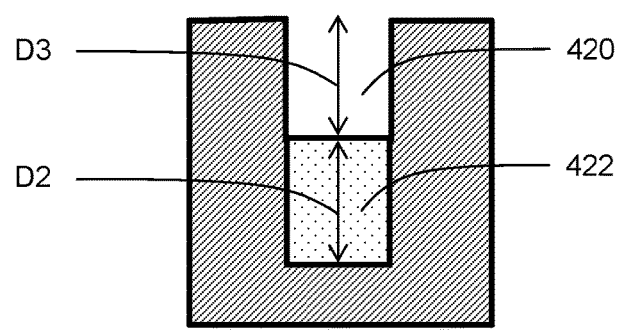

FIG. 4C is a detailed view of a section of FIG. 4B.

Figure 5A:
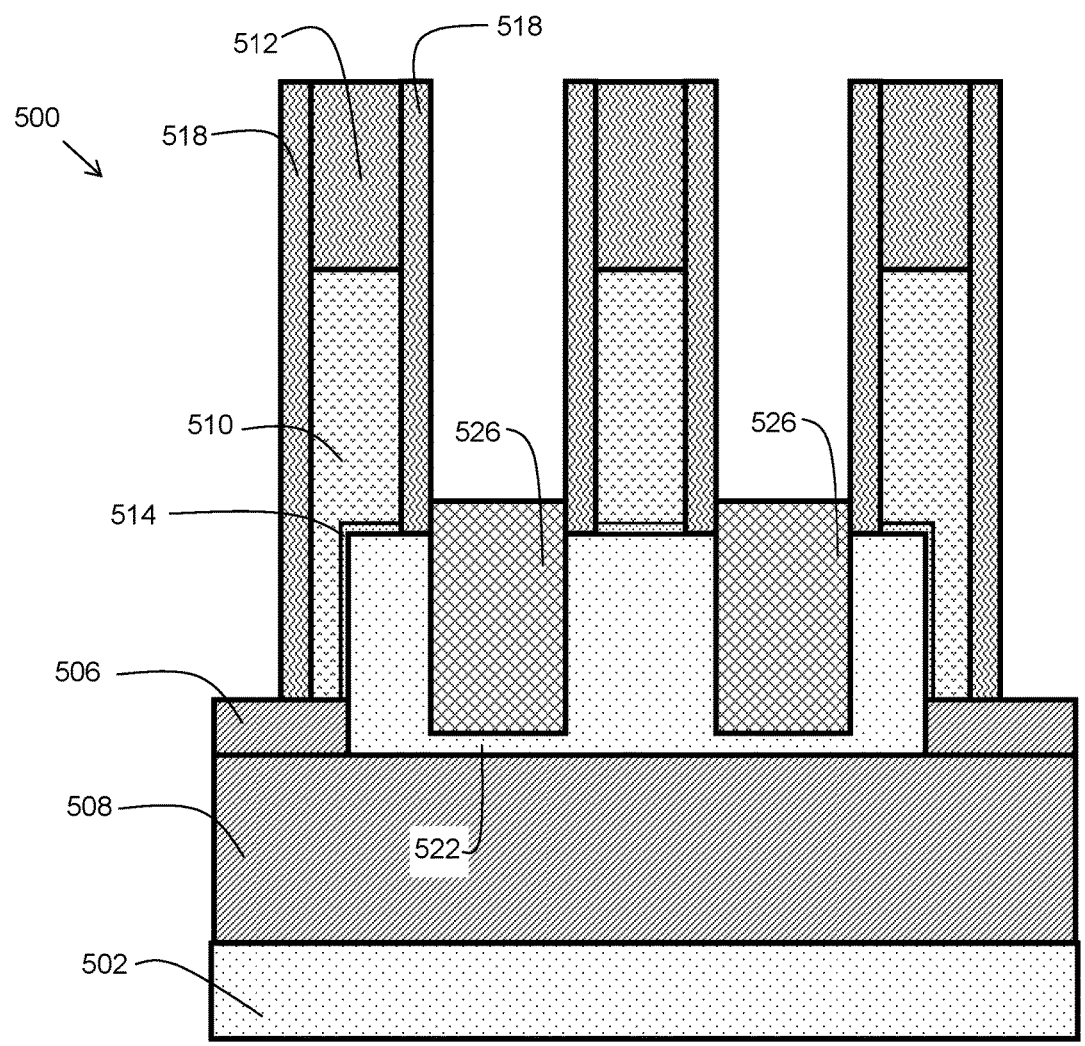

FIG. 5A is a cross sectional view of the semiconductor structure of FIG. 3A as viewed along line A-A' after a subsequent process step of forming epitaxial regions.

Figure 5B:
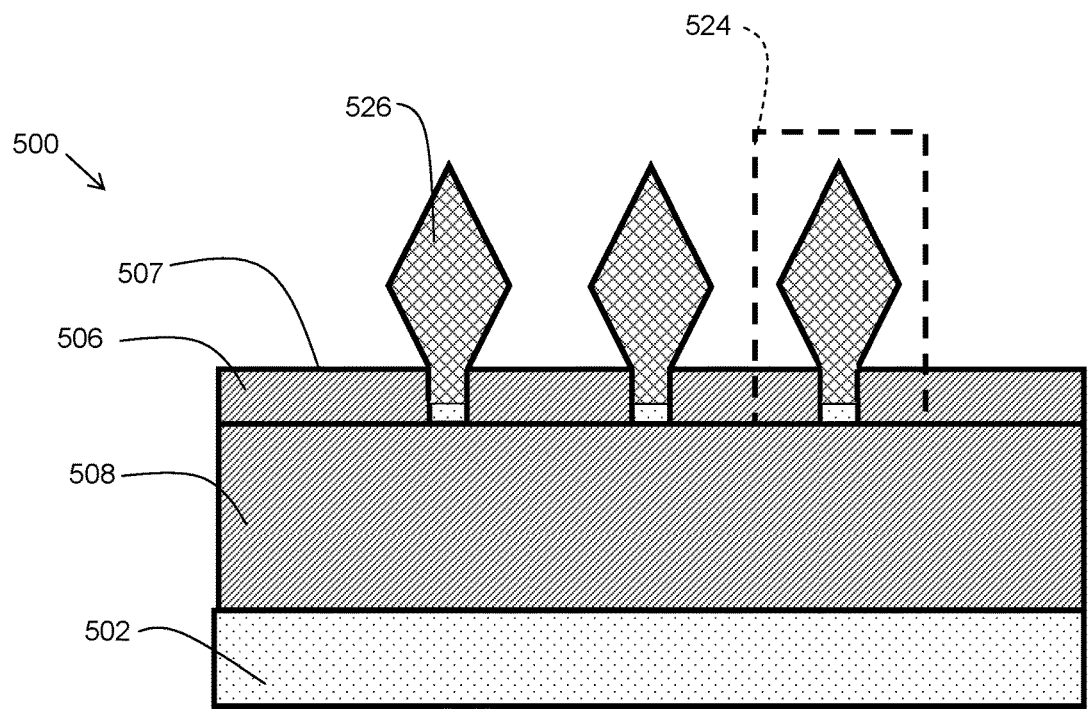

FIG. 5B is a cross sectional view of the semiconductor structure of FIG. 3A as viewed along line B-B' after a subsequent process step of forming epitaxial regions.

Figure 5C:
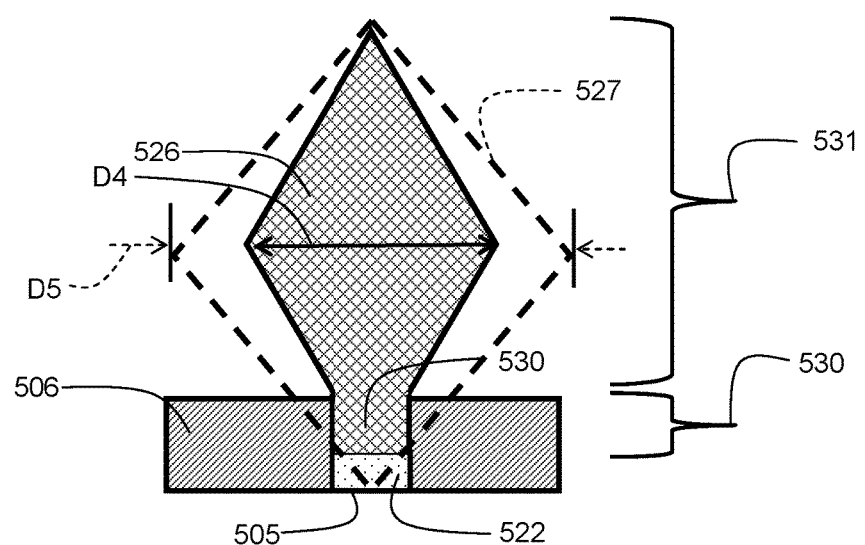

FIG. 5C is a detailed view of a section of FIG. 5B.

Figure 6:
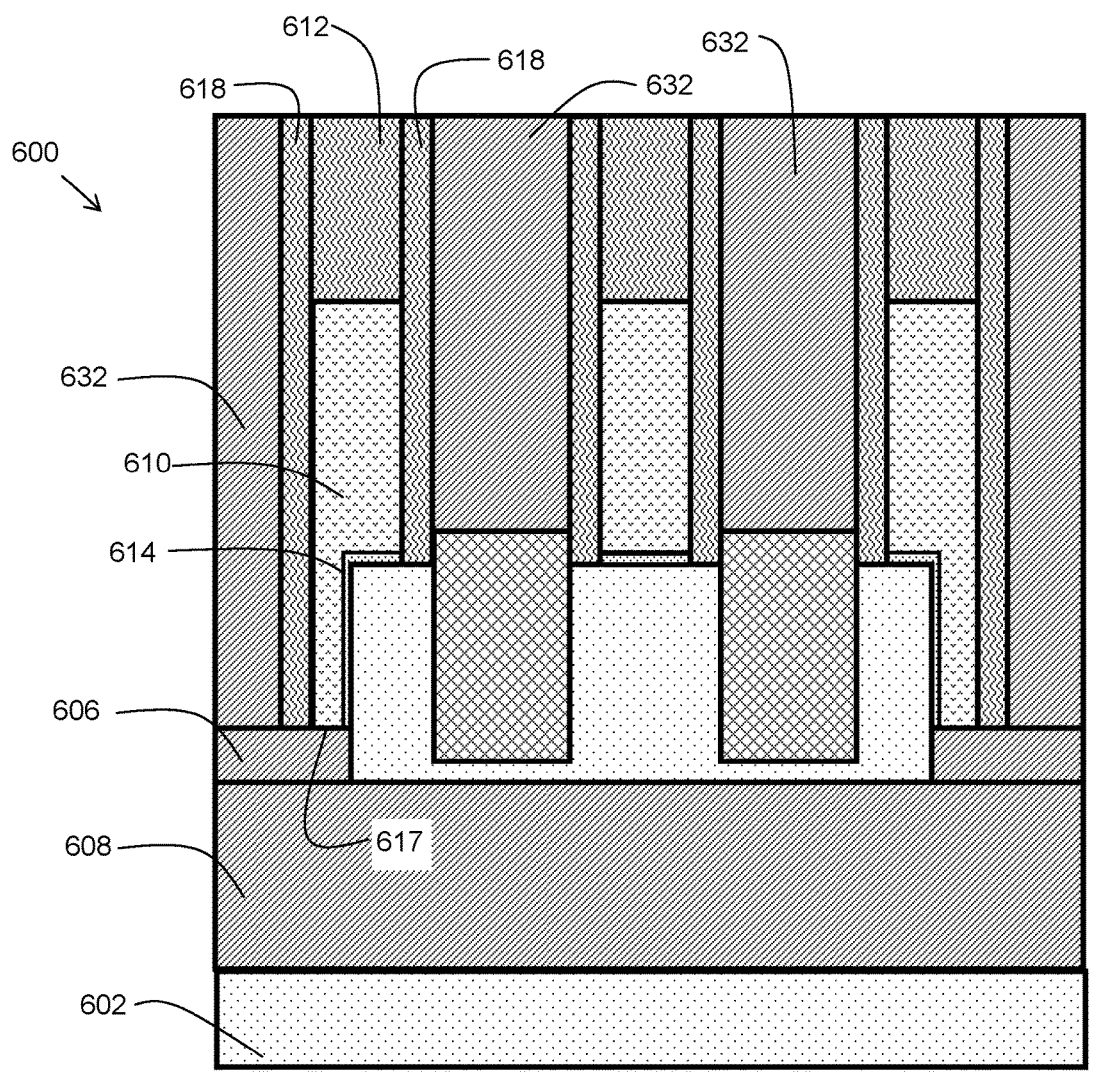

FIG. 6 is a cross sectional view of the semiconductor structure of FIG. 3A as viewed along line A-A' after a subsequent process step of depositing an interlayer dielectric (ILD).

Figure 7A:
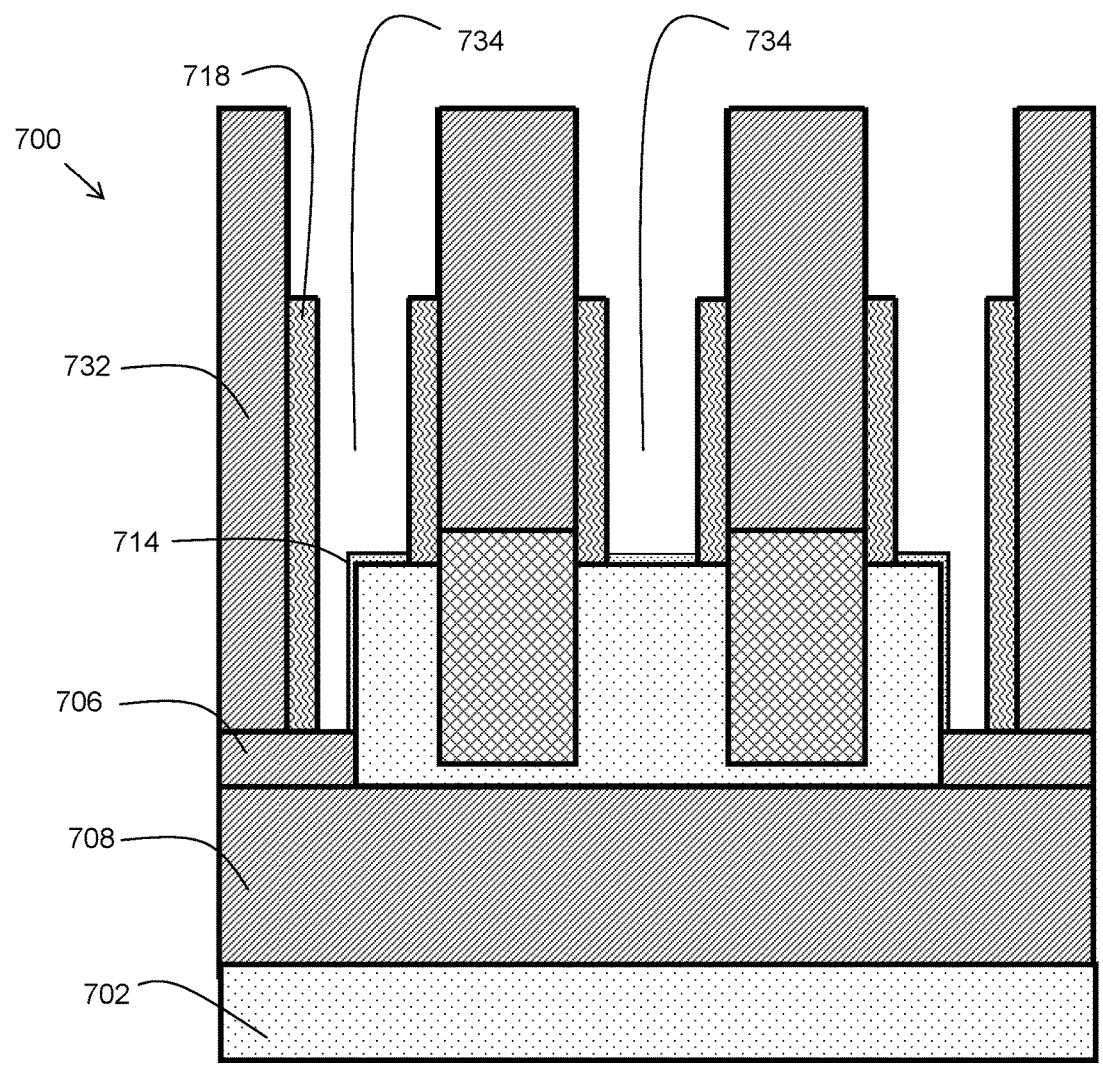

FIG. 7A is a cross sectional view of the semiconductor structure of FIG. 3A as viewed along line A-A' after a subsequent process step of removing the dummy gates.

Figure 7B:
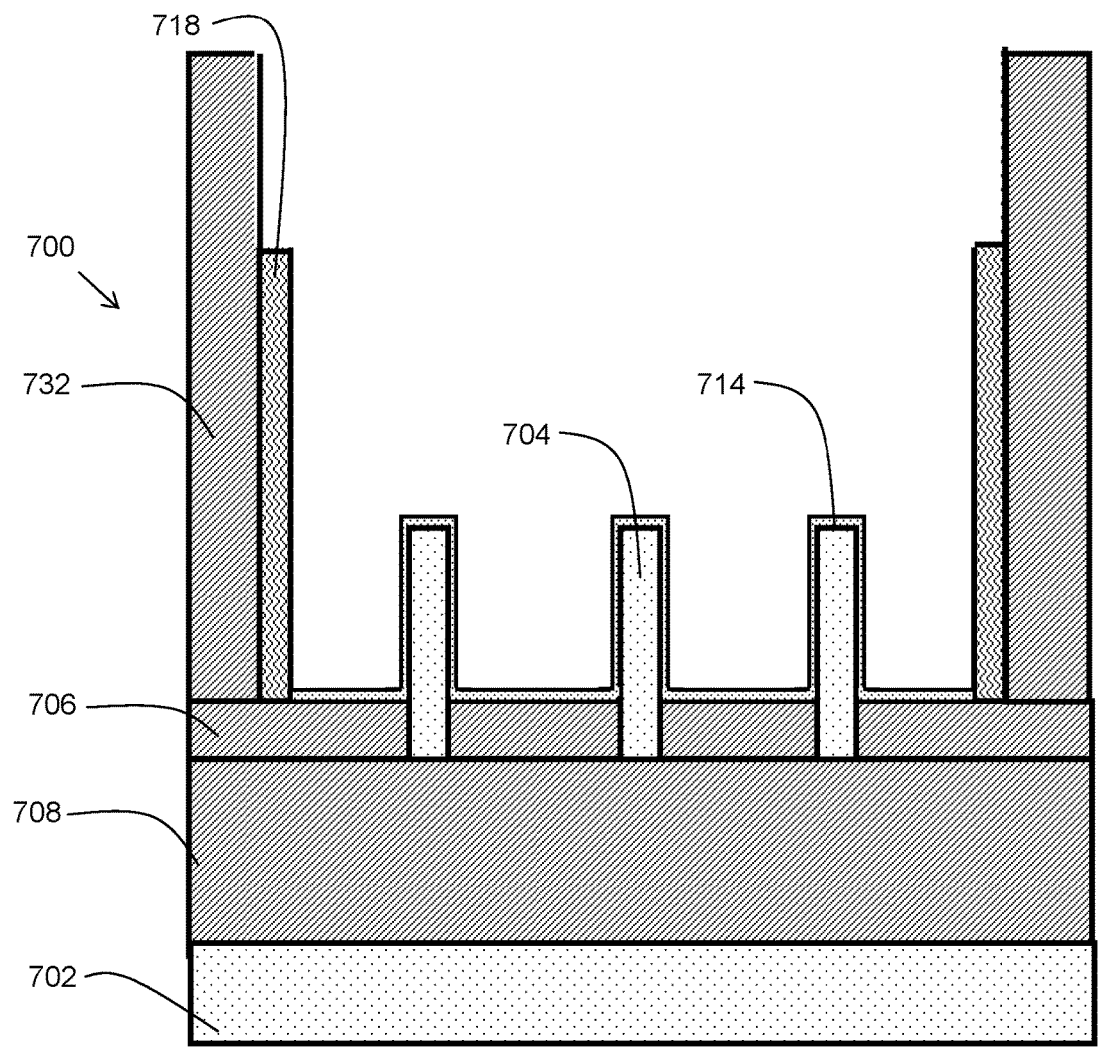

FIG. 7B is a cross sectional view of the semiconductor structure of FIG. 3A as viewed along line B-B' after a subsequent process step of removing the dummy gates.

Figure 8:
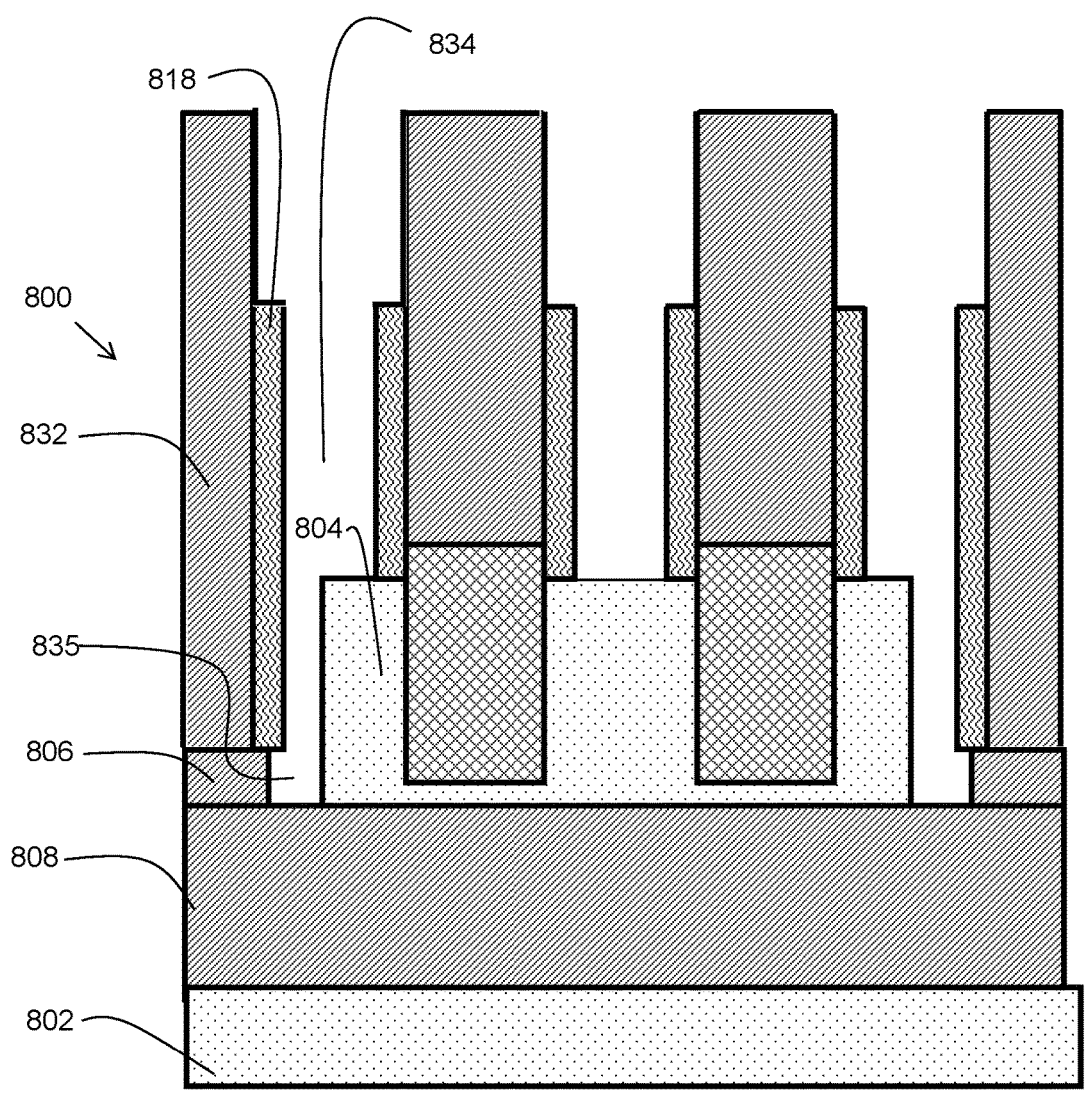

FIG. 8 is a cross sectional view of the semiconductor structure of FIG. 3A as viewed along line A-A' after a subsequent process step of removing the dummy gate dielectric.

Figure 9A:
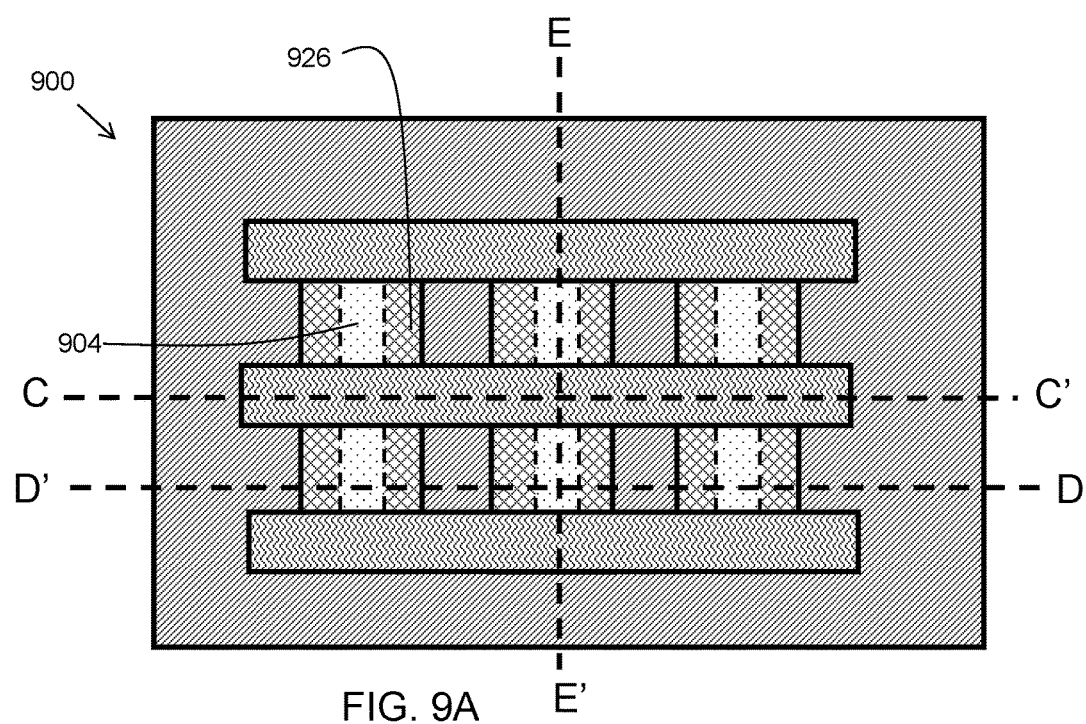

FIG. 9A is a top down view of a semiconductor structure after a subsequent process step of forming replacement metal gates.

Figure 9B:
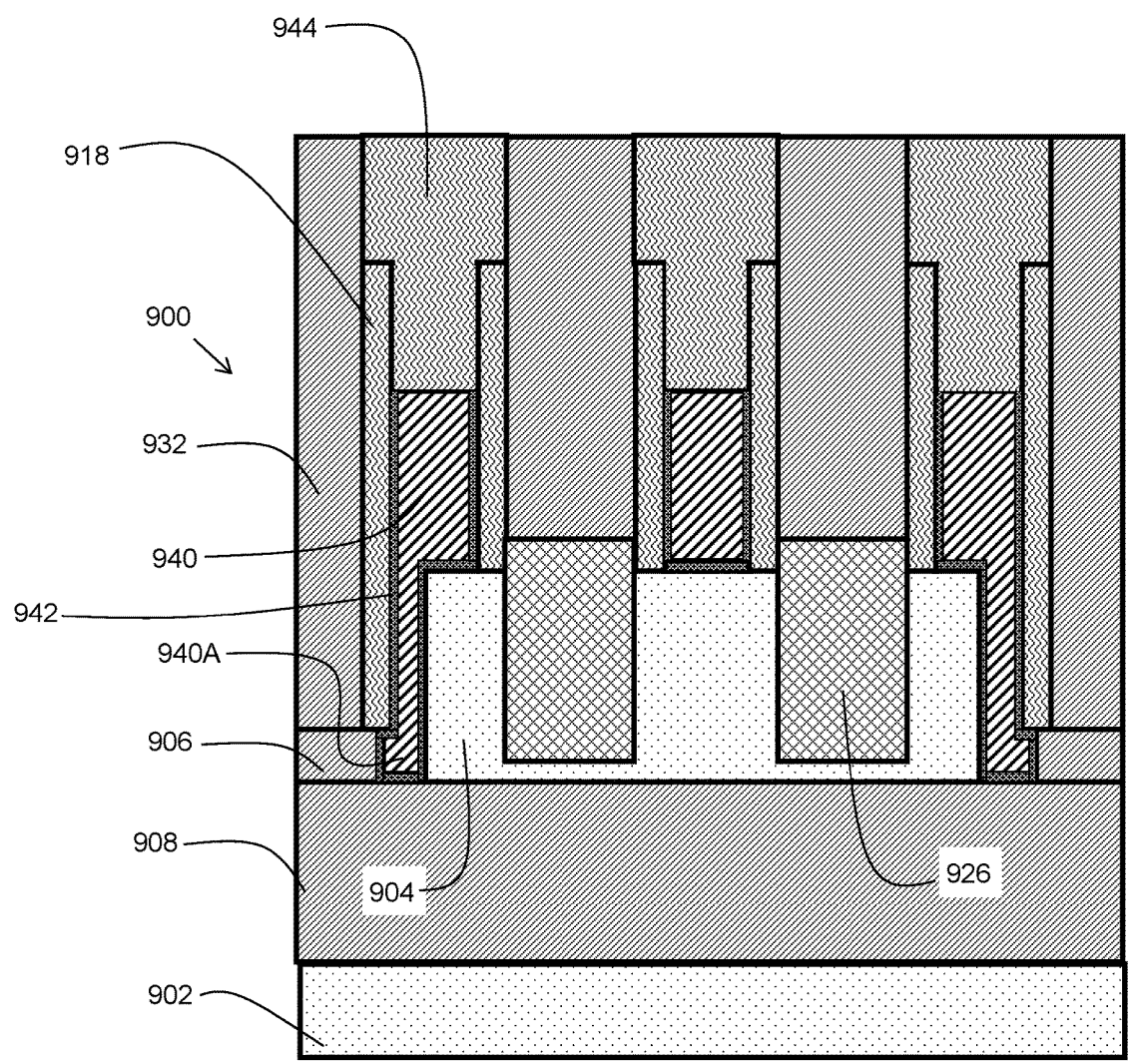

FIG. 9B is a cross sectional view of the semiconductor structure of FIG. 9A as viewed along line E-E' after a subsequent process step of forming replacement metal gates.

Figure 9C:
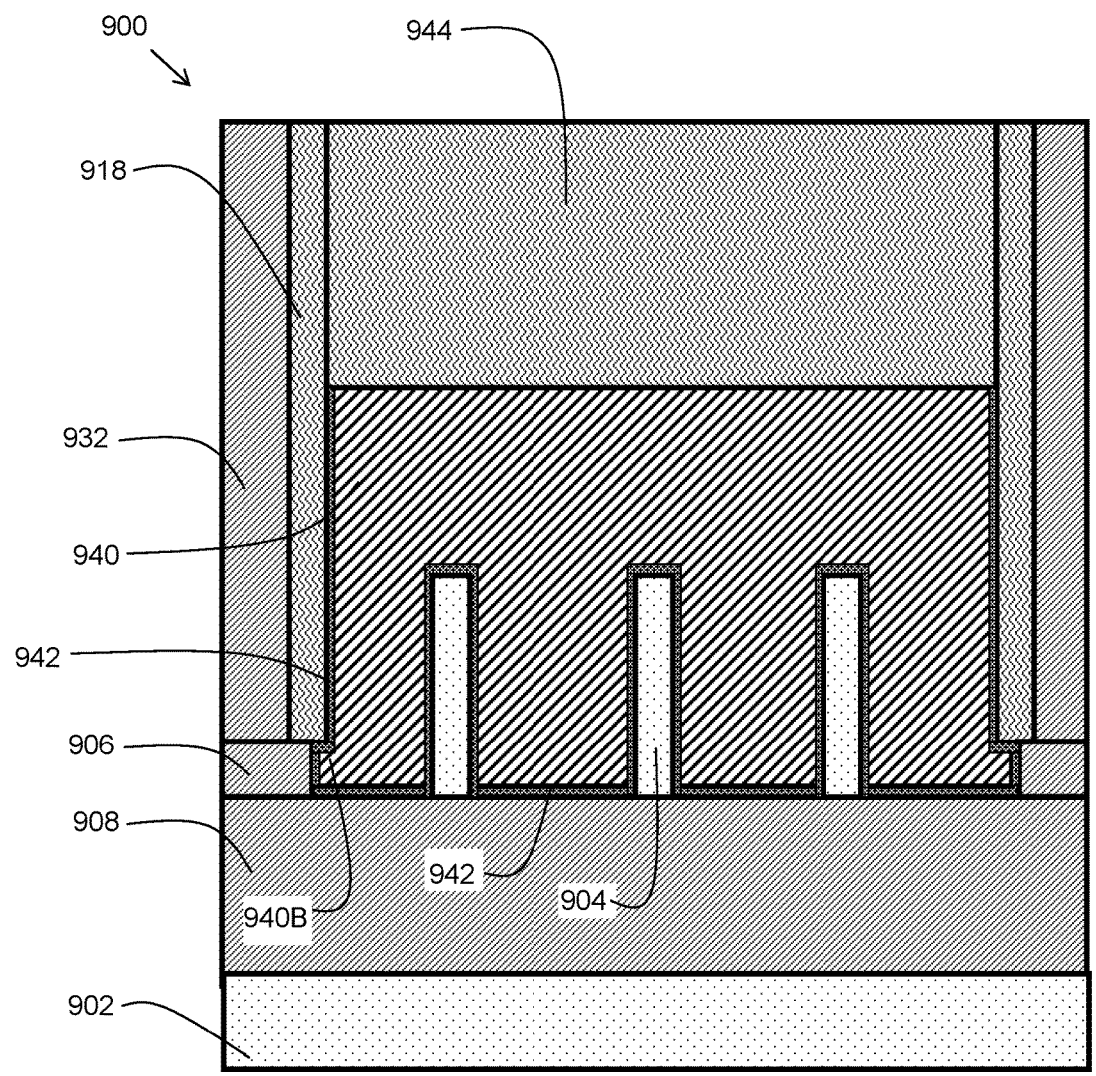

FIG. 9C is a cross sectional view of the semiconductor as viewed along line C-C' of FIG. 9A.

Figure 9D:
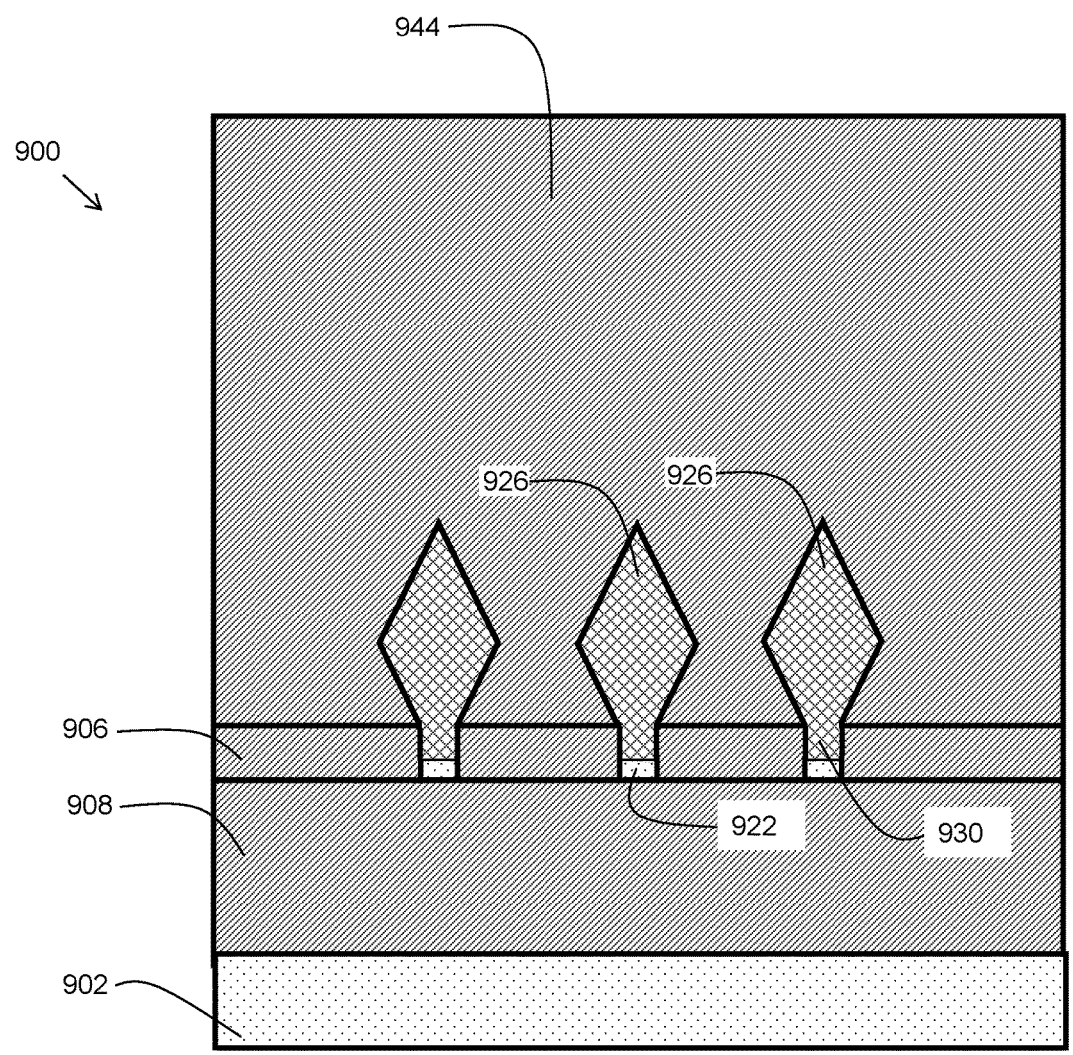

FIG. 9D is a cross sectional view of the semiconductor as viewed along line D-D' of FIG. 9A.

Figure 10:
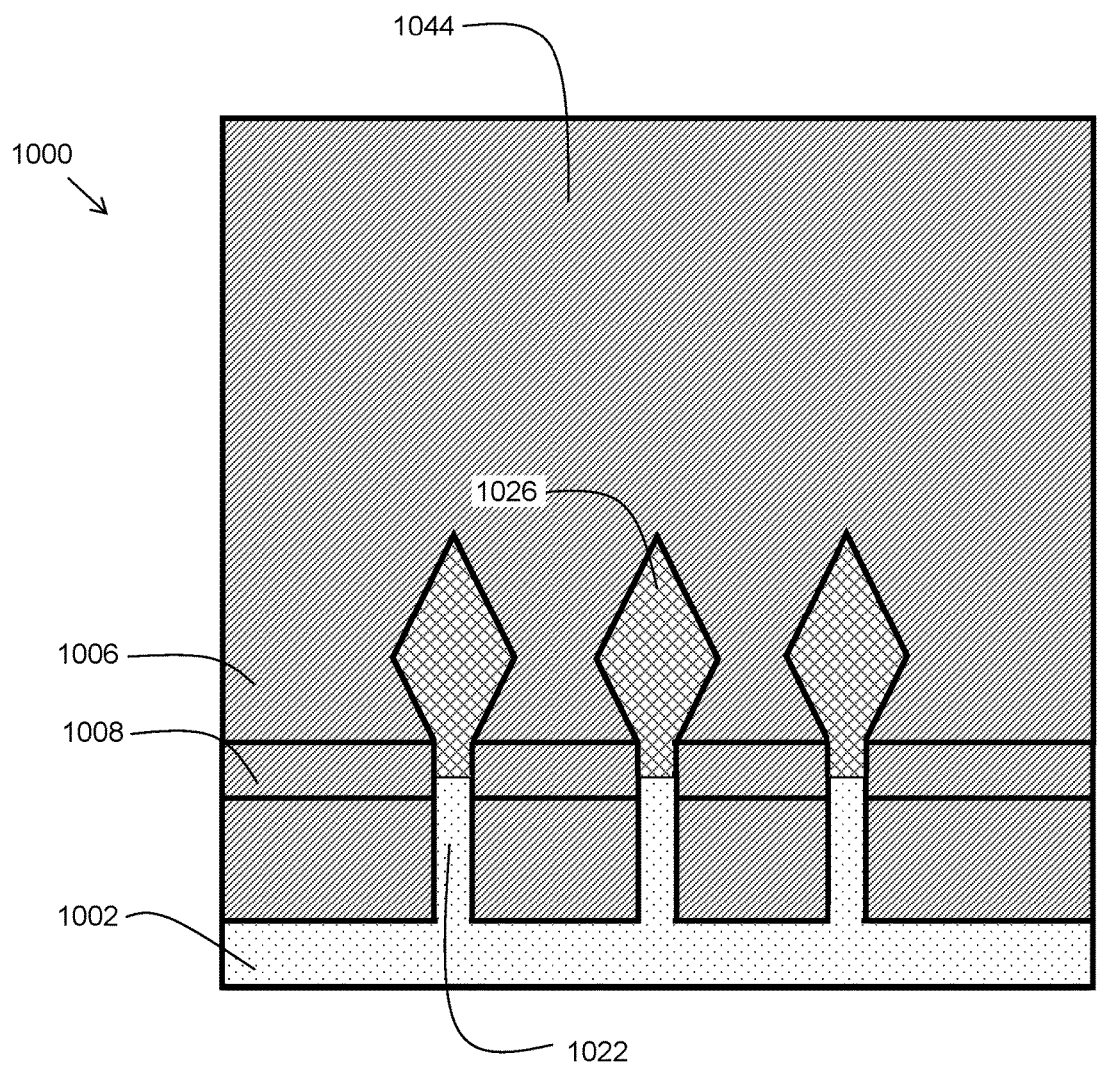

FIG. 10 is a cross sectional view of an alternative embodiment, utilizing bulk fins.

Figure 11:
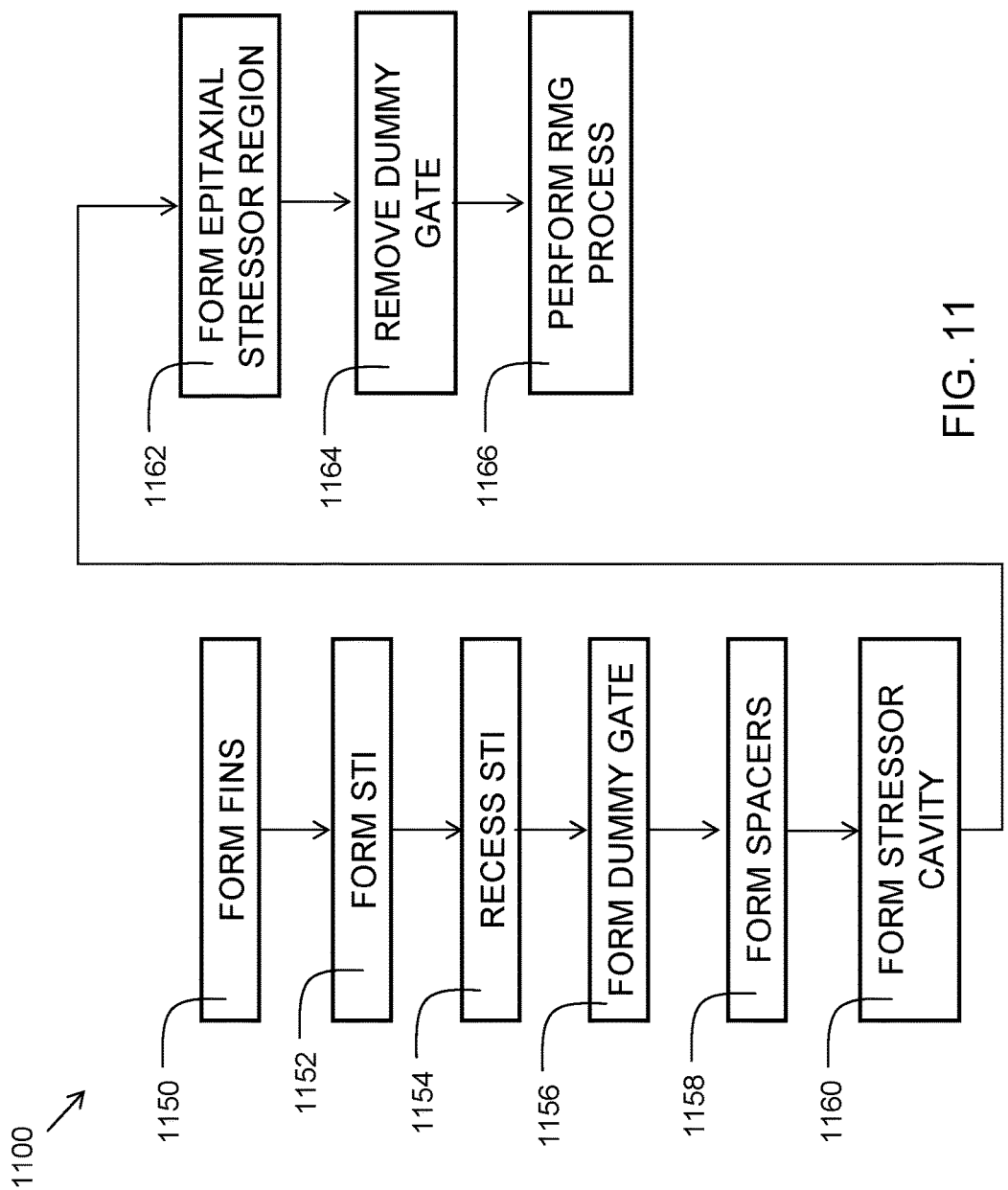

FIG. 11 is a flowchart indicating process steps for embodiments of the present invention.

DETAILED DESCRIPTION

Embodiments of the present invention provide a finFET structure and method of fabrication. A shallow trench isolation layer is formed on a structure comprising semiconductor fins. Portions of the fins are recessed to a level below the shallow trench isolation layer. Epitaxial stressor regions are then formed on the recessed fin areas. A bottom portion of the epitaxial stressor regions are contained by the shallow trench isolation layer, which delays formation of the diamond shape as the epitaxial region is grown. Once the epitaxial stressor regions exceed the level of the shallow trench isolation layer, the diamond shape starts to form. The result of delaying the start of the diamond growth pattern is that the epitaxial regions are narrower for a given fin height. Thus, embodiments of the present invention provide for increased fin height with reduced width of the epitaxial stressor regions. This allows for taller fins, which provide more current handling capacity, while the narrower epitaxial stressor regions enable a smaller fin pitch, allowing for increased circuit density. Additionally, the narrower epitaxial stressor regions results in a smaller parasitic capacitance between the epitaxial stressor and the gate, which in turn results in higher transistor performance.

FIG. 1A is a top down view of a semiconductor structure 100 at a starting point for embodiments of the present invention. In this view, a plurality of fins 104 are shown, protruding through a shallow trench isolation (STI) layer 106. In embodiments, the fins 104 may be comprised of silicon, silicon germanium, or other suitable semiconducting material. FIG. 1B is a cross sectional view of the semiconductor structure of FIG. 1A as viewed along line AA' of FIG. 1A. In this view, it can be seen that semiconductor structure 100 comprises a semiconductor substrate 102, which may comprise a bulk substrate such as a silicon wafer. Disposed on substrate 102 is an insulator layer 108. Insulator layer 108 may be comprised of silicon oxide, and may be referred to as a buried oxide (BOX) layer. The STI layer 106 is formed after the fins, such that it is adjacent to the fin 104. The STI layer 106 may be formed by depositing a relatively thick layer of silicon oxide, followed by a planarization process, such as a chemical mechanical polish (CMP) process. Then, the STI layer is recessed to a desired height D1, such that the top surface of 107 of the STI layer 106 is below the top surface 111 of the fin 104. This may be performed using a selective anisotropic etch process, such as a selective reactive ion etch (RIE) process. Thus, the STI layer 106 extends from the bottom 105 of the fins 104 to a thickness of D1. In some embodiments, D1 may range from about 10 nanometers to about 200 nanometers. Note that while the embodiment shown in FIGS. 1A-1B indicate a semiconductor-on-insulator (S 01) structure, embodiments of the present invention may also be utilized with "bulk" structures, FIG. 2A is a cross sectional view of a semiconductor structure 200 after a subsequent process step of forming dummy gates as viewed along line A-A' of FIG. 1A. As stated previously, similar elements may be referred to by similar numbers in various figures (FIGs) of the drawing, in which case typically the last two significant digits may be the same. For example, semiconductor substrate 202 of FIG. 2 is similar to semiconductor substrate 102 of FIG. 1. The dummy gate structure includes depositing a dummy gate dielectric 214, followed by forming a dummy gate 210 which is covered by pad layer 212. In embodiments, the dummy gate dielectric 214 is comprised of silicon oxide. In embodiments, the dummy gate 210 may be comprised of amorphous silicon or polysilicon. In embodiments, the pad layer 212 is comprised of silicon nitride. FIG. 2B is a cross sectional view of a semiconductor structure after a subsequent process step of forming dummy gates as viewed along line B-B' of FIG. 1A.

FIG. 3A is a top down view of a semiconductor structure 300 after a subsequent process step of forming gate spacers. In embodiments, the gate spacers 318 may be comprised of silicon nitride (SiN). FIG. 3B is a cross sectional view of the semiconductor structure of FIG. 3A as viewed along line A-A'. The spacers 318 extend to the top of fin 304, or to the top of the STI layer 306 in places where there is no fin.

FIG. 4A is a cross sectional view of a semiconductor structure 400 (as viewed along line A-A' of FIG. 3A) after a subsequent process step of fin recess. The fin 404 is anisotropically recessed to form stressor cavities 420. In embodiments, the anisotropic recess is performed with a selective reactive ion etch process. The fin is not completely removed in the stressor cavities, such that a fin base 422 remains. FIG. 4B is a cross sectional view of semiconductor structure 400 as viewed along line B-B' of FIG. 3A after a subsequent process step of fin recess. As can be seen in this view, the recess is performed such that the top 423 of the fin base is below the top 407 of the STI layer 406.

FIG. 4C is a detailed view of a section of FIG. 4B as indicated by box 424. As can be seen in FIG. 4C, the fin base 422 has a depth D2. In embodiments, D2 may range from about 5 nanometers to about 20 nanometers. The stressor cavity 420 has a depth D3. In embodiments, the depth D3 may range from about 5 nanometers to about 20 nanometers. The depth D3 defines the thickness of the base portion of a tree shaped epitaxial region, as will be shown in upcoming figures.

FIG. 5A is a cross sectional view of semiconductor structure 500 as viewed along line A-A' of FIG. 3A after a subsequent process step of forming epitaxial regions 526. In embodiments, the epitaxial regions may comprise silicon, silicon germanium (SiGe), silicon carbon (SiC), or other suitable material. In some embodiments, the epitaxial regions 526 may be in-situ doped by a suitable dopant such as boron, phosphorus, or arsenic by adding a gas that contains the dopant species during the epitaxial growth. FIG. 5B is a cross sectional view of semiconductor structure 500 as viewed along line B-B' of FIG. 3A after a subsequent process step of forming epitaxial regions. As can be seen in this view, the epitaxial regions 526 form on the fin base 522 in a diamond shape once the height exceeds the top 507 of the STI layer 506, and the epitaxial region is no longer contained by the STI layer 506. The diamond shape is due to the properties of the crystalline planes of the epitaxial material. In embodiments, parameters of the epitaxial growth process such as temperature, pressure or the gas mixture are controlled so that the growth rate on the (111) crystallographic planes of the epitaxial regions 526 is significantly lower than the growth rate on other planes such as (100) and (110). For example, by adding a chlorine containing gas such as HCl during the epitaxy process, it is possible to reduce the growth rate on (111) crystallographic planes. FIG. 5C is a detailed view of a section of FIG. 5B as indicated by box 524 in FIG. 5B. As can be seen in FIG. 5C, epitaxial region 526 has a width D4. In embodiments, D4 may range from about 20 nanometers to about 50 nanometers. The epitaxial region 526 comprises a contained base portion 530 that is contained by the STI layer 506 to delay the formation of the diamond shape, and thus reduce the final width of the epitaxial region. The contained base portion 530 is disposed at a distance D2 (see FIG. 4C) from the bottom 505 of the fin. Outline 527 indicates a theoretical epitaxial shape that is grown without a contained fin base 522. That is, if the epitaxy starts growing uncontained, it ultimately reaches the diamond shape indicated by outline 527, and having a width D5, where D5>D4. Thus, the epitaxial region 526 is formed in a tree shape such that it has a base portion 530 that is substantially rectangular, with a diamond portion 531 disposed on the base portion 530. The diamond portion 531 is bounded by (111) crystalline planes. The epitaxial region 530 has the same height as the theoretical epitaxial shape indicated by outline 527, but has a reduced width, allowing for a reduced fin pitch that serves to increase circuit density while maintaining an increased current capacity for the finFET devices on an integrated circuit.

FIG. 6 is a cross sectional view of a semiconductor structure 600 as viewed along line A-A' of FIG. 3A after a subsequent process step of depositing an interlayer dielectric (ILD) 632. In embodiments, the ILD 632 may comprise silicon oxide, and may be deposited using a chemical vapor deposition (CVD) process. A planarization step may follow to make the top of the ILD 632 flush with the pad layer 612 and spacers 618. The bottom 617 of dummy gate structure 610 is in contact with shallow trench isolation layer 606.

FIG. 7A is a cross sectional view of a semiconductor structure 700 as viewed along line A-A' of FIG. 3A after a subsequent process step of removing the dummy gates (compare with 610 of FIG. 6). As a result of removing the dummy gates, gate cavities 734 are formed. At this stage, the dummy gate dielectric 714 remains at the bottom of the gate cavities 734. FIG. 7B is a cross sectional view of semiconductor structure 700 as viewed along line B-B' of FIG. 3A after a subsequent process step of removing the dummy gates. As part of the removal of the dummy gates, the spacers 718 are recessed to a level below the top of the ILD 732.

FIG. 8 is a cross sectional view of semiconductor structure 800 as viewed along line A-A' of FIG. 3A after a subsequent process step of removing the dummy gate dielectric (compare with 714 of FIG. 7A). In embodiments, the dummy gate dielectric is removed using an isotropic etch process that also etches a portion of the STI layer 806, such that the STI layer is now recessed below the bottom (see 617 of FIG. 6) of the dummy gate structures that were removed in a previous step. The etch is selective such that it does not substantially etch the spacers 818. Thus, a lower region 835 of the gate cavity 834 is formed. The lower region 835 of the gate cavity 834 extends below and directly underneath a portion of spacer 818.

FIG. 9A is a top down view of a semiconductor structure 900 after a subsequent process step of forming replacement metal gates. FIG. 9B is a cross sectional view of the semiconductor structure 900 of FIG. 9A as viewed along line E-E' after a subsequent process step of forming replacement metal gates. Note that the epitaxial regions 926 cover the tops of the fins 904. However, in FIG. 9A, the fins 904 are shown within the epitaxial regions 926 to illustrate the fin position within the epitaxial regions. The replacement metal gate (RMG) process may include deposition of a high-K gate dielectric 942. In embodiments, the high-K gate dielectric 942 may include hafnium oxide, hafnium silicate, or other suitable material. In embodiments, the high-K gate dielectric 942 is deposited using an atomic layer deposition (ALD) process. A replacement metal gate 940 is then formed in the gate cavity. The replacement metal gate 940 may include one or more barrier layers and work function metals (not shown) along with one or more fill metals. The gates are then capped with additional capping layer material 944. In embodiments, capping layer material 944 comprises silicon nitride. As can be seen in this view, due to the lower region 835 (see FIG. 8), the high-K dielectric 942 and a lower portion 940A of the replacement metal gate 940 are disposed below and directly underneath the spacer 918. Additionally, a portion of the STI layer 906 is disposed below, and directly underneath, and in direct physical contact with, the spacers 918. FIG. 9C is a cross sectional view of the semiconductor structure 900 as viewed along line C-C' of FIG. 9A. As can be seen in this view, along the gate edge, gate region 940B is disposed below and directly underneath spacers 918, as is a portion of the high-K dielectric layer 942. FIG. 9D is a cross sectional view of the semiconductor structure 900 as viewed along line D-D' of FIG. 9A. As can be seen in this view, epitaxial regions 926 are diamond shaped, and furthermore comprise a contained base portion 930 that is contained by the STI layer 906 to reduce the final width of the epitaxial region (as illustrated in FIG. 5C).

FIG. 10 is a cross sectional view of a semiconductor structure 1000 in accordance with an alternative embodiment, utilizing bulk fins 1022 that are formed from bulk substrate 1002. As stated previously, embodiments of the present invention may be utilized with both SOI and bulk finFET structures.

FIG. 11 is a flowchart 1100 indicating process steps for embodiments of the present invention. In process step 1150, fins are formed. In embodiments, this may comprise using a sidewall image transfer (SIT) process or other suitable technique. In process step 1152, an STI layer is formed (see 106 of FIG. 1B). This may comprise depositing silicon oxide using a chemical vapor deposition process, followed by a planarization process using a chemical mechanical polish. In process step 1154 a recess of the STI layer is performed. This may comprise using a selective reactive ion etch (RIE) process. In process step 1156, a dummy gate is formed (see 200 of FIG. 2A). This may include deposition of a dummy gate dielectric, followed by a dummy gate fill material and a capping layer. In process step 1158, spacers are formed (see 318 of FIG. 3B). In embodiments, this may include depositing a conformal silicon nitride layer, followed by an anisotropic etch process. In process step 1160, stressor cavities are formed (see 420 of FIG. 4A). The stressor cavities may be formed using an anisotropic etch process, such that a base portion of the fin remains at the bottom of the stressor cavity (see 422 of FIG. 4A). In process step 1162, epitaxial stressor regions are formed (see 526 of FIG. 5B). The epitaxial stressor regions comprise a contained base portion (see 530 of FIG. 5C) to delay the diamond shape growth and thus reduce the width of the epitaxial stressor regions. In process step 1164, the dummy gates are removed (see 800 of FIG. 8). In process step 1166, an RMG process is performed to form replacement metal gates (see 900 of FIG. 9C). From this point forward, industry-standard techniques may be used to complete the fabrication of the integrated circuit.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims, and advantageous for any given or particular application.

What is claimed is:

1. A semiconductor structure comprising:
   a semiconductor substrate;
   a semiconductor fin disposed over the semiconductor substrate, the semiconductor fin comprising a fin base;
   a shallow trench isolation layer on the substrate;
   a gate on the semiconductor fin, the gate comprising a gate spacer on a surface of the shallow trench isolation layer; and
   a tree shaped epitaxial region disposed on the fin base;
   wherein a sidewall of the shallow trench isolation layer is recessed to form a cavity below a bottom surface of the gate spacer; and
   wherein a portion of the gate fills the cavity.

2. The semiconductor structure of claim 1, wherein the fin base has a thickness that ranges from about 5 nanometers to about 20 nanometers.

3. The semiconductor structure of claim 1, wherein the epitaxial region comprises a base portion having a thickness ranging from about 5 nanometers to about 20 nanometers.

4. The semiconductor structure of claim 3, wherein the epitaxial region is comprised of silicon germanium.

5. The semiconductor structure of claim 3, wherein the epitaxial region is comprised of silicon carbon.

6. A semiconductor structure comprising:
   a semiconductor substrate comprising a buried oxide layer;
   a semiconductor fin disposed on the buried oxide layer, the semiconductor fin comprising a fin base;
   a tree shaped epitaxial region disposed on the fin base;
   a shallow trench isolation layer on the buried oxide layer;
   a gate structure disposed on the semiconductor fin, the gate structure comprising a gate spacer on a surface of the shallow trench isolation layer;
   wherein a sidewall of the shallow trench isolation layer is recessed to form a cavity below a bottom surface of the gate spacer, the cavity exposing a surface of the buried oxide layer; and
   wherein a portion of the gate structure fills the cavity.

7. The semiconductor structure of claim 6, wherein the epitaxial region comprises a base portion having a thickness ranging from about 5 nanometers to about 15 nanometers.

8. The semiconductor structure of claim 7, wherein the epitaxial region is comprised of silicon germanium.

9. The semiconductor structure of claim 7, wherein the epitaxial region is comprised of silicon carbon.

10. The semiconductor structure of claim 7, wherein the fin base has a thickness that ranges from about 5 nanometers to about 15 nanometers.

11. The semiconductor structure of claim 6, wherein the gate structure comprises a gate dielectric, and wherein the gate dielectric is disposed underneath at least one of the plurality of spacers.

12. The semiconductor structure of claim 11, wherein the epitaxial region comprises a diamond portion having a width ranging from about 20 nanometers to about 50 nanometers.

13. The semiconductor structure of claim 12, wherein the epitaxial region comprises a contained base portion disposed below the diamond portion.

* * * * *